July 7, 1970 D. H. SINKER 3,519,767

PUNCH CARD READER INCLUDING A SERIES OF SWITCH ASSEMBLIES MOUNTED ON THE EDGE OF A CIRCUIT BOARD

Filed Oct. 20, 1966 2 Sheets-Sheet 1

INVENTOR.
DAVID H. SINKER
BY Flam and Flam
ATTORNEYS.

July 7, 1970 D. H. SINKER 3,519,767

PUNCH CARD READER INCLUDING A SERIES OF SWITCH ASSEMBLIES MOUNTED ON THE EDGE OF A CIRCUIT BOARD

Filed Oct. 20, 1966 2 Sheets-Sheet 2

INVENTOR.
DAVID H. SINKER
BY Flam and Flam
ATTORNEYS.

United States Patent Office 3,519,767
Patented July 7, 1970

3,519,767
PUNCH CARD READER INCLUDING A SERIES OF SWITCH ASSEMBLIES MOUNTED ON THE EDGE OF A CIRCUIT BOARD

David H. Sinker, 1519 S. Beverly Drive, Los Angeles, Calif. 90035

Filed Oct. 20, 1966, Ser. No. 588,014
Int. Cl. G06k 7/04
U.S. Cl. 200—46 23 Claims

ABSTRACT OF THE DISCLOSURE

A series of individual switch assembles are stacked on the edge of a printed circuit board for engagement with sensing pins of a digital reader. Each switch assembly includes a body the legs of which receive the edge of the circuit board. A bowed spring is mounted on the inside of one of the legs and forms a contact wiper. A coiled compression spring is captured between the legs and located so that one end may directly engage the edge of the circuit board, thus determining one state of a two-state switch as well as providing the requisite force for outward bias of the sensing pins engaged thereby.

This invention relates to card readers for the computer arts, and more particularly to a reader for an analog function generator or the like in which a switch element must be physically moved in accordance with the encoded data to ensure infinite resistance when the switch element is in open position.

It has been common to mount conventional snap switches so that their plunger actuators project through a reader platen, and to provide suitable wiring and connectors to logic matrices, amplifiers, etc. If there are a hundred or so switches, obviously the size of the reader platen is necessarily large. Since every effort is made to use the smallest possible space by locating the snap switches close together, wiring is tedious and time consuming.

It has been proposed to use a switch element that slides along a printed circuit board, thus achieving a measure of increased compactness and at the same time avoiding a good deal of wiring. One known device requires a complicated composite circuit board that slidably mounts the switch element. Cost is increased, and the saving in space is not substantial. Another known device utilizes adjacent boards to sandwich a switch element between them, the switch element engaging contact buttons of both boards to accomplish switching functions. This arrangement requires careful mounting of the circuit boards to ensure proper contact pressures, precise alignment, etc. Moreover, the assembly of the entire device is complicated.

One of the primary objects of this invention is to provide a compact switch element that can be used in cooperation with a single conventional circuit board. No precise alignment between adjacent circuit boards is required.

Another object of this invention is to provide a switch element that is mounted entirely by the conventional circuit board and without any alteration of the circuit board itself. Assembly of such switch elements with circuit boards is accordingly simplified.

Another object of this invention is to provide a switch element that can be slipped over the edge of the board which by its own function characteristics stays in place preparatory to the assembly of the board and switch into a case.

Another object of this invention is to provide a switch element of this character that incorporates a spring for urging the switch in one direction relative to the circuit board and for determining a free position of the switch element relative to the board, all despite the fact that no holes, brackets or other devices are provided in or on the circuit board itself, and despite the fact that the switch element is mounted entirely by the circuit board.

Another object of this invention is to provide a switch element of this character that can be installed and properly positioned relative to the circuit board in a matter of a few seconds.

Still another object of this invention is to provide a switch element of this character so designed that a plurality of circuit boards each mounting a plurality of switch elements may readily be assembled in a card reader.

Another object of this invention is to provide a device of this character in which the platen area per switch unit is so small as to be compatible with the spacing of punch holes in a standard IBM card. Acordingly, such data cards can be used to operate the reader, with consequent increased efficiency in an integrated system.

The foregoing objects are made possible by a simple three-part switch element. One part is a clip of bifurcated form that embraces the edge of the circuit board. The second part is a spring contact wiper carried by one of the arms of the clip that serves not only to develop the requisite contact pressure, but also to develop frictional force holding the clip in position. The third part is a coiled retraction spring captured by the clip and located at the trough area thereof to engage the edge of the circuit board for biasing and locating purposes.

Another object of this invention is to provide a card reader in which a platen accurately mounts a series of sensing pins, the sensing pin having heads behind the platen that contact the end of the clip. The coiled retraction spring of the clip serves as the means for projecting the corresponding pin toward sensing position. Precise axial alignment between the sensing pins and the clips is not required, the data card holder being accurately guidingly mounted on the platen.

Another object of this invention is to provide a simple and improved mounting between the data card holder and the platen through which the sensing pins project together with a simple toggle mechanism for moving the holder and platen together.

This invention possesses many other advantages and has other objects which may be made more clearly apparent from a consideration of one embodiment of the invention. For this purpose, there is shown a form in the drawings accompanying and forming a part of the present specification, and which drawings are true scale. This form will now be described in detail, illustrating the general principles of the invention; but it is to be understood that this detailed description is not to be taken in a limiting sense, since the scope of this invention is best defined by the appended claims.

DETAILED DESCRIPTION

Figure 1:
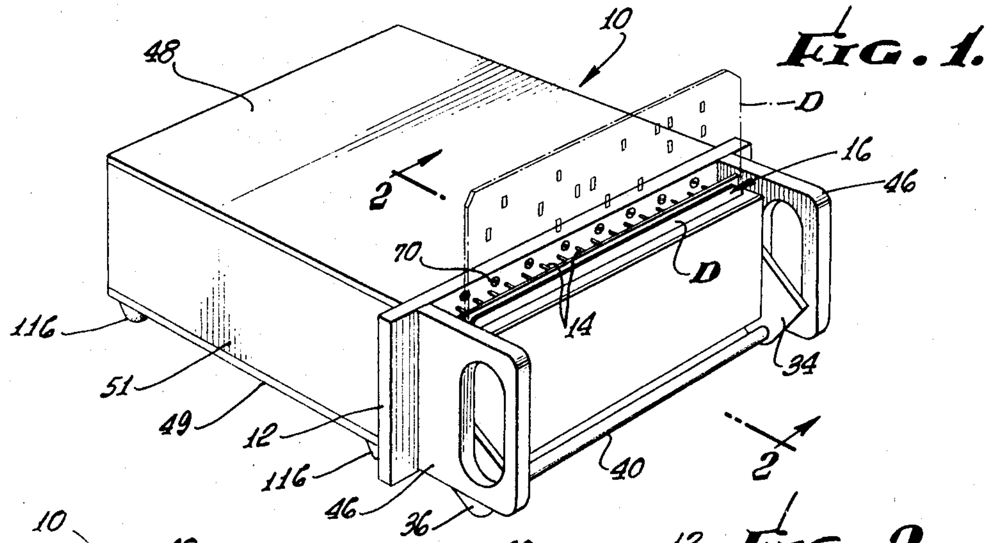
FIG. 1 is a pictorial view of a function generator incorporating the present invention.

The function generator 10 shown in FIG. 1 includes a platen 12. The platen 12 mounts a substantial number of sensing pins 14. In the present instance there are twenty-three columns of twelve pins mounted by the platen. The sensing pins 14 (FIGS. 2 and 3) extend through and are guided by carefully located apertures 15. The pins are a good deal longer than the platen is thick. Normally the pins project forwardly at the frontally exposed surface of the platen for cooperation with a data card holder 16. The pins 14 have heads 17 at their inner ends to determine the limit of outward movement.

The data card holder 16 is guided for movement in a fixed path perpendicular to the platen 12. For this purpose two or more guide posts 18 (FIG. 5) are carried by the data card holder. The guide posts are received in bushings 20 mounted by the platen 12 and located laterally just beyond the end rows of pins 14.

A top opening slot is formed in the holder 16 for insertion of the card D. The slot is formed in part by a relatively thick base plate 22 having a shallow recess 24 in its frontal surface that accurately corresponds to the configuration of the card D. This recess extends to the top edge of the plate 22; but the bottom and sides of the recess terminate short of the lower and side edges. A cover plate 28 overlies the frontal surface of the base plate 22 and is attached thereto about the sides and bottom of the shallow recess 24. The top of the cover plate 28 projects above the plate 22 to form a guide for insertion of the card D. The guide posts 18 are carried by the cover plate 28.

The base 22 and the cover plate 28 are provided with an array of holes 30 and 32 to register with the pins and the possible location of holes in the data card D. When the data card holder 16 is projected toward the plate 12 (FIG. 6), the pins will enter the openings 32. Holes in the data card D permit the corresponding pins to pass freely. Where there are no holes, the corresponding pins will be moved inwardly to operate an array of switches to be hereinafter described.

In order to move the data card holder 16, a crank structure is provided. The crank structure includes two parallel crank arms 34 and 36 (see also FIG. 1) located at the sides of the holder 16. Each crank has on its inner surface a pin 38 (FIGS. 2 and 5) pivotally mounting the crank to the corresponding side edge of the base plate 22. The crank arms 34 and 36 each mount cam rollers, as at 42 (FIGS. 2 and 5), on their outer surfaces. These rollers 42 work in vertical slots 44 formed on the inner faces of handles 46 which project forwardly of the platen 12. The axes of the rollers 42 are offset from the axes of the pins 38. Accordingly, upon angular movement of the cranks 34 and 36, the data card holder 16 will be reciprocated. As is apparent from a consideration of FIG. 6, the distance between the slots 44 and the frontal surface of the platen 12 just equals or is very slightly greater than the sum of the center-to-center distance between the rollers 42 and the pins 38 plus the distance between the pin 38 and the frontal surface of the card holder 16. Accordingly, when the card holder reaches the forward limit of travel, as by counterclockwise crank movement, the holder is close to or in contact with the platen 12. Upon continued movement of the crank in a clockwise direction, the holder begins to rearact as the pin 38 moves over center, and as shown in FIG. 6. In a manner to be hereinafter described, the pins 14 are spring pressed outwardly. Hence, those pins 14 that engage the card D resiliently urge the card holder away from the platen. Counterclockwise movement of the cranks 34 and 36 is limited by engagement of the cranks with the frontal surface of the platen, as shown in FIG. 6. In this position, the pin 38 has moved slightly past center, and the spring pressed sensing pins 14 tend to maintain the cranks in engagement with the platen 12. A stable closed position of the reader is thus determined. The reader is readily opened by outward movement of the handle 40. Pins 47 (FIG. 2), carried by the handles 46, engage the cranks to determine the maximum open position of the holder 16.

Secured to the edges about the rear surface of the platen 12 are top and bottom walls 48 and 49, side walls 50 (FIG. 5) and 51 (FIG. 1) together forming an enclosure for a plurality of printed circuit cards or boards 52 (FIGS. 2, 3 and 5), switch elements 54 (FIGS. 2 and 3), connector sockets 56 (FIG. 6) and leads, connectors, etc. The printed circuit boards 52 are placed in vertical side-by-side relationship. The circuit boards are aligned with the vertical rows of sensing pins 14, there being one circuit board for each row.

Figure 2:
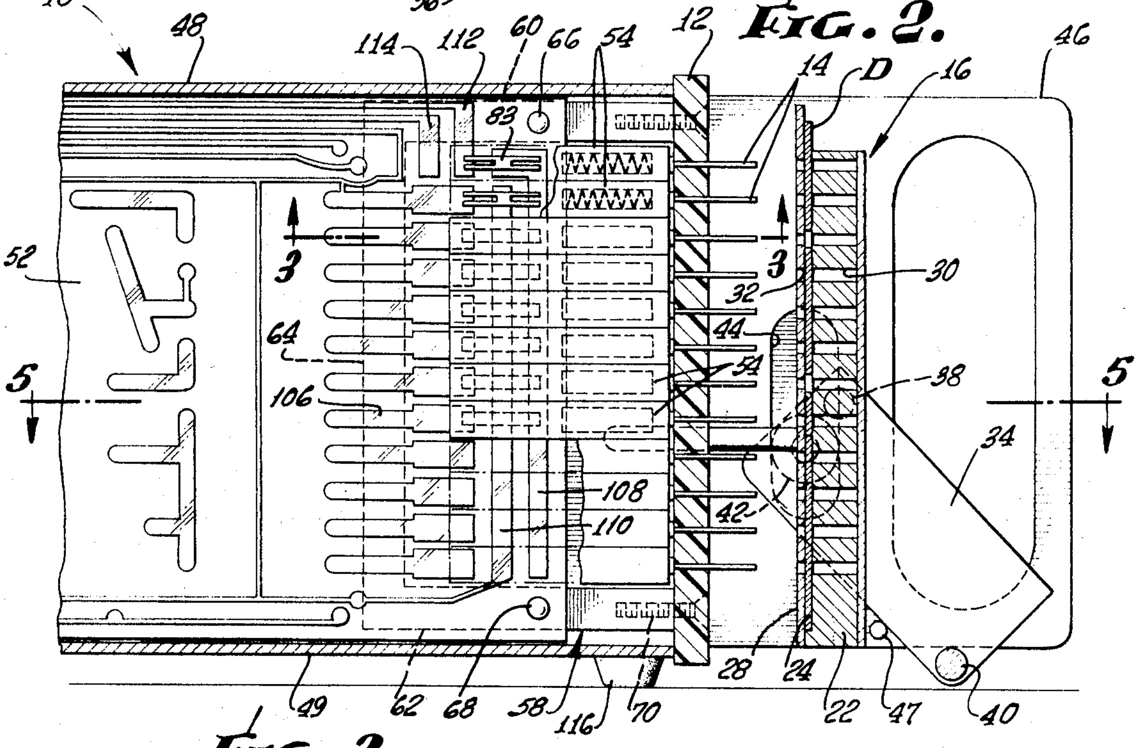
FIG. 2 is an enlarged longitudinal sectional view of the function generator shown in FIG. 1, and taken along the vertical plane indicated by line 2—2 of FIG. 1.
Figure 5:
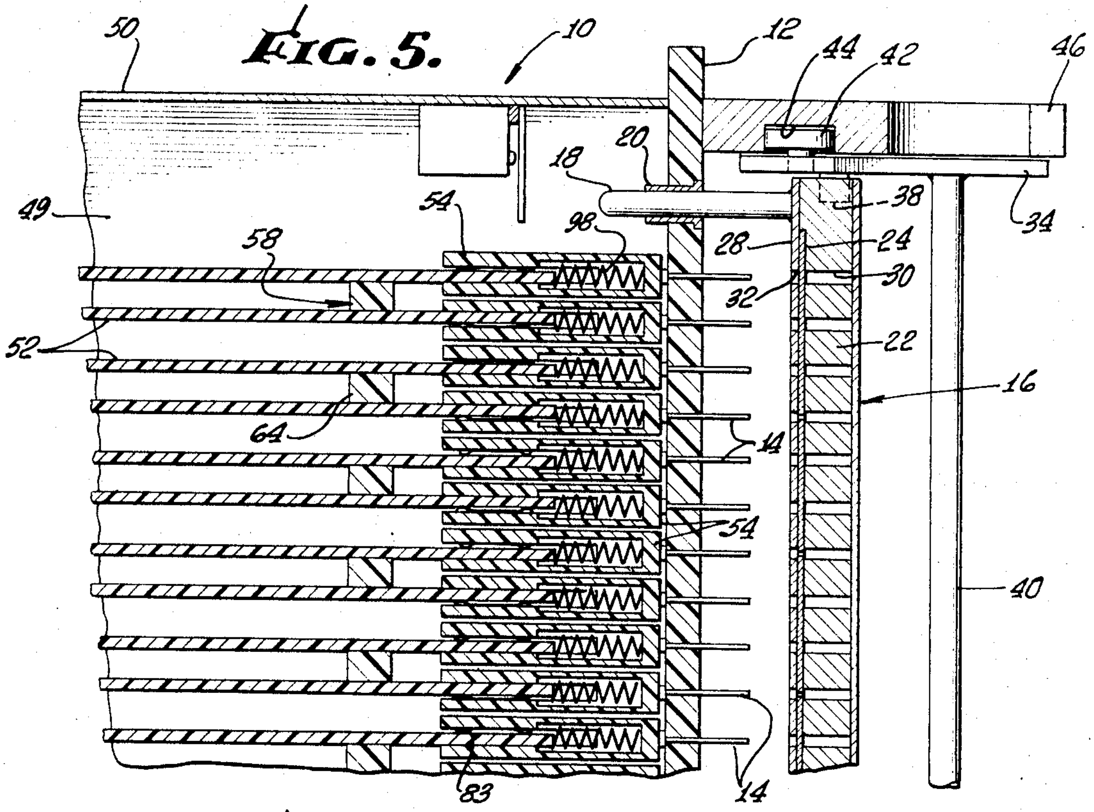
FIG. 5 is a fragmentary sectional view taken along a plane corresponding line 5—5 of FIG. 2.
Figures 6, 7:
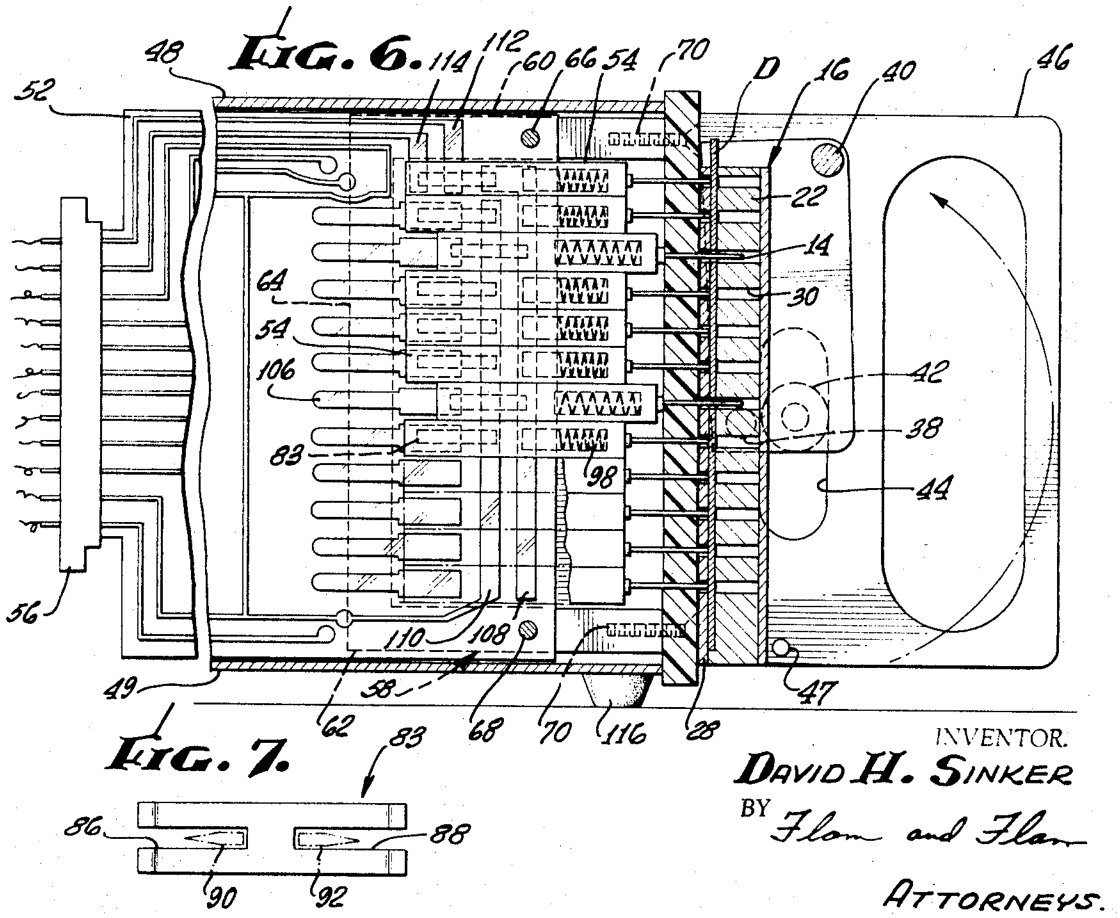
FIG. 6 is a view similar to FIG. 2 illustrating the reader in closed position.
FIG. 7 is a plan view of the contact wiper forming a part of the switch element.

Pairs of circuit boards 52 are held in spaced side-by-side pre-assembled relationship by the aid of generally C-shaped spacer brackets 58 (FIGS. 2 and 5). One bracket 58 is provided for each pair of boards 52. These brackets cooperate with the forward or inner ends of the boards 52. Each bracket has an upper leg 60 that falls along and is almost flush with the upper edge of the two adjacent circuit boards. The lower leg 62 falls along and is almost flush with the lower edges of the two adjacent boards. The legs of the bracket project beyond the vertical edges of the boards. The central connecting leg 64 of the C-shaped brackets is inwardly offset from the edge of the board. Accordingly, the inner ends of the boards adjacent the sensing pins 14 are accessible for purposes of mounting the switch elements 54 in a manner hereinafter to be described.

Screws 66 and 68 (FIGS. 2 and 6) clamp the two adjacent boards together on opposite sides of the C-shaped bracket. Screws 70 attach the brackets to the rear of the platen 12.

Each circuit board 52 (FIG. 2) mounts along its inner edge, a stack of switches 54 corresponding in number to the number of pins 14 in the vertical row. The switch elements are identical, and a description of one suffices as a description of all. The element 54 includes a mounting part in the form of a bifurcated clip 74 (FIG. 3) made of molded plastic material. The clip 74 has boundaries corresponding substantially to a rectangular parallelepiped. A slot 76, extending from one end of the clip 74 to an inward terminus 78, divides the clip into two legs 80 and 82 spaced sufficiently to receive between them the edge of the printed circuit board 52. The width of the slot 76 is somewhat in excess of the nominal thickness of the circuit board 52.

Figure 4:
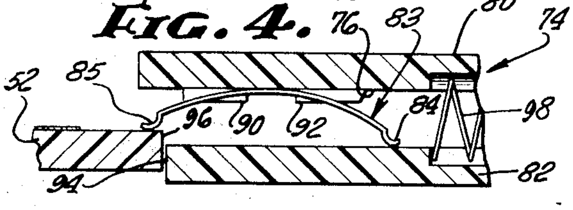
FIG. 4 is a fragmentary sectional view similar to FIG. 3 illustrating the manner in which the switch element is installed at the edge of the circuit board.

One of the legs 80 mounts a contact wiper 83. The contact wiper 83, as shown in FIG. 7, is formed as a strip of beryllium copper or similar light electrically conductive spring stock material. It has a normal bowed configuration, as indicated in FIG. 4, with its ends suitably curved to provide rounded contact points 84 and 85 for engagement with the circuit board. Extending inwardly from opposite ends of the bowed wiper are slots 86 and 88 that bifurcate the contact points. Thus these parts are independently flexible. Even if one part should fail to make contact, the other will. The slots 86 and 88 interfit integrally cast spaced lugs 90 and 92 formed on the inner surface of the clip leg 80. The lugs 90 and 92 hold the contact wiper 83 in longitudinal alignment with the clip and at a fixed position along the length of the clip.

Before the switch element 54 is installed on the circuit board (FIG. 4), the contact points 84 and 85 abut the flat surface on the inside of the opposite leg 82. The outer contact point 85 projects slightly beyond the inner corner 94 of the leg 82. By moving the switch element 54 downwardly with the corner 96 of the circuit board edge adjacent the corner 94, the contact wiper 83 is flexed to allow entry of the circuit board 52. As the circuit board enters, it cams the opposite and inner end of the bowed contact wiper upwardly until the corner 96 is clear. Thereupon, the parts assume the orientation illustrated in FIG. 3. In this position, the contact wiper 83 is flexed and it presses against the corresponding surface of the circuit board 52 with a certain pressure. This pressure is balanced by contact pressure between the opposite leg 82 with the opposite side of the circuit board 52.

A coiled retraction spring 98 is provided for urging the switch element 54 outwardly of the edge of the circuit board 52. The coiled spring 98 is accommodated in a cylindrical recess 100 centrally aligned between the clip legs and located at the trough area therebetween. This cylindrical recess is intersected by the slot 76, the end of the slot 78 being located substantially intermediate the ends of the cylindrical recess 100. The diameter of the cylindrical recess is slightly greater than the width of the slot 76. Accordingly, upper and lower shoulders 102 and 104 are formed. The spring 98 is large enough in diameter so as to be captured between the bottom of the cylindrical recess 100 and the shoulders 102 and 104. The spring 98 accordingly is held in place on the clip 74 without assistance of the board 52. Thus the previously described assembly of the clip 74 to the board proceeds without attention to the retraction spring. The spring 98 is inserted through an opening 99 at the base of the clip 74. The aperture 99, which is reverse tapered, is closed by a plug 101 force fitted therein.

The wiper contact 82 is shielded by virtue of the fact that the leg 80 on which the contact wiper 83 is installed is longer than the opposite arm or bifurcation 82. No special precautions are necessary in handling the switch elements 54 prior to assembly with the boards.

Figure 3:
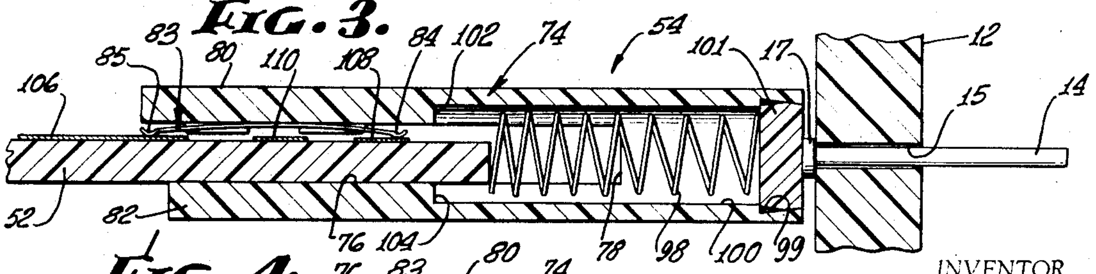
FIG. 3 is a further enlarged fragmentary sectional view taken along a plane corresponding line 3—3 of FIG. 2.

Each switch element 54 is normally positioned on the board 52 so that the end of the coil spring is engaged and moved inwardly. Thus as shown in FIG. 3, the distance between the edge of the board 52 and the inner surface of the platen 12 is a good deal less than the distance between the shoulders 102 and 104 from the end of the clip 74 adjacent the platen 12. Thus the coil spring 98, acting on the clip 74, urges the clip, the sensing pin 14 and the holder 16 outwardly. However, before the boards are secured to the platen 12, the switch assemblies remain in place at the edge of the boards. The spring, being captured by the shoulders 102 and 104, becomes ineffective to exert an outward thrust on the switch 54 when the edge of the board is in alignment with the shoulders 102 and 104. In this position, the contact points 84 are still on the board since the contact points 84 terminate beyond the end of the recess for the spring as defined by the shoulders 102 and 104.

The height of the clip along the edge of the card corresponds precisely to the center-to-center distance of the sensing pins. The switch elements 54 are stacked one upon the other, with the top and bottom units confined by the corresponding arms of the C-shaped assembly or spacer brackets 58. The switch elements are individually slidable inwardly and outwardly of the board edge, the clip of the switch element below serving as a bearing. The switch elements are positioned in alignment with the sensing pins 14. Since the pins are small and the ends of the clips large, alignment is not critical.

The contact elements 54 move inwardly and outwardly with the sensing pins 14. The springs 98 not only retract the corresponding contact elements, but also urge the pins 14 and the holder 16 outwardly. Since the springs 98 perform all of these functions, the aggregate force on the holder 16 is much less than it would be if separate springs were used to perform these various functions.

Printed on that side of the circuit board 52 engaged by the contact wiper 83 (FIG. 3) is a printed contact segment 106. The clip 74, when in the normal position illustrated in FIGS. 2 and 3, locates the contact point 85 so as to engage the forward portion of the printed contact segment 106. This contact point 85 remains continually in engagement with the segment 106. The inner contact point 84 in the position shown in FIGS. 2 and 3 engages a printed bus bar 108. Upon inward movement of the clip 74, the contact point 84 moves from engagement with the bus bar 108 and into engagement with another bus bar 110. Accordingly, a switching function is accomplished.

All the switch elements except the upper clip operate in a similar manner, there being corresponding individual printed contact segments extending in vertical array along the circuit board 52. The upper clip 54 has its inner contact point 84 continually in engagement with a widened end of the bus bar 108. The outer contact point 85 normally engages a contact segment 112, but when the clip is moved inwardly, it engages a segment 114 instead. The specific arrangement of contact sets is, of course, a matter of choice.

The outer ends of the boards 52, as shown in FIG. 6, cooperate with conventional connectors 56. Suitable wiring is provided between the connectors, and a suitable socket may be provided for power input and for signal output. The unit has feet 116 attached to the lower case wall 49. However, the platen is laterally extended so as to permit rack mounting.

By virtue of the design of switch and companion components, the function generator 10 is quite compact; the individual switch elements can be located sufficiently close to cooperate with a standard IBM data card.

The inventor claims:

1. In combination: a printed circuit board having an outer edge and contact segments on one side of said board adjacent said edge; a clip made of electrical insulation material having legs spaced between them to receive said edge of said circuit board; electrically conductive contact wiper means carried on the inside of one of said legs; and resilient means designed to react against said one side of a circuit board to provide a contact pressure between said wiper means and said circuit board opposed by the other of said legs; the other of said legs being in direct frictional engagement with the other side of said circuit board; said clip being movable from an inward position to an outward position relative to the edge of the board, said other of said legs and said wiper means both maintaining frictional contact with said board in and between said two positions; said wiper means having different contact relationships with said contact segments in said two positions.

2. The combination as set forth in claim 1 in which said contact wiper means is formed as a normally resilient strip itself forming the resiliently urging means.

3. The combination as set forth in claim 2 in which said one of said legs is provided with mounting lugs interfitting said contact wiper means releasably to hold said contact wiper means in alignment with said clip and in a longitudinally adjusted position therealong, said wiper means resiliently maintaining itself in seated relationship with said mounting lugs.

4. The combination as set forth in claim 2 in which said contact wiper means has arcuate contact points at opposite ends of the wiper means, the ends of the wiper means being respectively located inwardly and outwardly of the legs.

5. The combination as set forth in claim 4 in which said one of said legs is longer than the other of said legs, said contact point at the outer end of said wiper means normally contacting and projecting slightly beyond the inside corner at the end of the said other of said legs whereby said contact wiper means may be flexed to receive the edge of the circuit board by engaging the edge of the circuit board.

6. The combination as set forth in claim 5 in which said one of said legs extends beyond said wiper means in order to shield said outer contact point before assembly with said circuit board.

7. In combination: a printed circuit board having an edge; contact segments printed on one side of said circuit board adjacent said edge; a plurality of individual unconnected clips each having legs encompassing said circuit board, and having a connecting portion extending across said circuit board edge; electrically conductive contact wiper means carried on the inside of one of said legs and engaging said one side of said circuit board; and resilient means engaging one side of said circuit board and providing contact pressure between said wiper means and said one side of said circuit board opposed by the other of said legs, the connecting portion of said clip transmitting the force between the legs;

said clips being stacked adjacent and in running contact with each other along said edge; and means holding said stacked clips in longitudinal position along the edge of said circuit board whereby said clips are capable of individual movement inwardly and outwardly of the circuit board.

8. The combination as set forth in claim 1 together with a coiled retraction spring accommodated between the legs to be engaged by the edge of the circuit board for providing a bias on the clip urging said clip outwardly of the edge of said circuit board.

9. The combination as set forth in claim 1 in which said clip is provided with a longitudinally extending recess at the trough between the legs and extending along the attached ends of the legs; said contact wiper means being located at the distal ends of the legs beyond said recess; and a coil spring captured in said recess and engageable with the edge of the circuit board for outwardly urging the clip and the wiper means carried thereby.

10. The combination as set forth in claim 8 together with a coiled retraction spring accommodated between the legs of each clip to be engaged by the edge of the circuit board for providing a bias on the clip urging said clip outwardly of the edge of said circuit board; a platen; a plurality of sensing pins mounted by the platen and substantially aligned with said clips for inward movement of the clips upon corresponding movement of said sensing pins.

11. The combination as set forth in claim 10 together with a card holder guided for movement relative to said platen and located on that side of the platen opposite said clips; a toggle linkage for the holder and designed to provide a toggle crest when the holder is adjacent the platen; said springs serving to maintain the holder in a toggle locked position by exerting a force on the card and thereby to the holder.

12. In combination: a platen; a plurality of sensing pins carried by the platen and having ends projecting forwardly of a frontal surface of said platen; a card holder; a toggle type linkage between the platen and the card holder having an open and a toggle locked position; and resilient means yieldingly holding the sensing pins in a projected position, and acting through the card held by said card holder upon said toggle type linkage to hold said toggle type linkage in the said toggle locked position, said card holder being movable in a path free of other resilient means.

13. For use in a digital reader having one or more printed circuit boards:

(a) a switch body having two opposed legs joined by a central connecting portion;

(b) said legs being spaced from each other to receive between them the edge of a printed circuit board;

(c) wiper contact means mounted on the inside of one of the legs adjacent the distal end of the leg, said wiper contact means being positioned to engage one side of said circuit board adjacent its said edge;

(d) means operative resiliently to urge said contact wiper means to engage said one side of said circuit board with a contact force for frictionally coupling said switch body to said board;

(e) a compression spring in said switch body and said connecting portion with one end of said spring engaging said connecting portion;

(f) said body having wall means confining said spring between said legs and forming a stop limiting outward movement of the other end of said spring while exposing said other spring end for engagement with the edge of said circuit board;

(g) said switch body having a surface on the outside of said connecting portion designed to engage a sensing pin.

14. The combination as set forth in claim 13 in which said one of said legs is longer than the other and projects longitudinally beyond said wiper contact means to shield said wiper contact means; said wiper contact means contacting said other leg at its very end when said switch body is separated from said circuit board, said wiper contact means being positioned to be slightly exposed beyond the end of said other leg whereby said wiper contact means is exposed for engagement with the edge of said circuit board for retraction of said wiper contact means thereby for installing said switch body.

15. The combination as set forth in claim 13 together with a platen; a sensing pin mounted by said platen for registry at one end with a data card, said pin having a head at its other end positioned to be engaged by said outside surface of said connecting portion whereby said spring provides a bias force for said pin, said head having a small area relative to said outside surface of said connecting portion whereby precise alignment is uncritical.

16. The combination as set forth in claim 13 in which said wiper contact means are formed at the ends of a bowed resilient element, the central portion of which interfits lug means on the inside of said one leg.

17. In combination: a printed circuit board having an edge; contact segments printed on one side of said circuit board adjacent said edge; a plurality of individual switch assemblies stacked along the said edge of said circuit board, each switch assembly including (a) a switch body having two opposed legs joined by a central connecting portion;

(b) said legs being spaced from each other to receive between them said edge of a printed circuit board;

(c) wiper contact means mounted on the inside of one of the legs adjacent the distal end of the leg, said wiper contact means being positioned to engage one side of said circuit board adjacent its said edge;

(d) means operative resiliently to urge said contact wiper means to engage said one side of said circuit board with a contact force for frictionally coupling said switch body to said board;

(e) a compression spring in said switch body and located between said switch body legs adjacent said connecting portion with one end of said spring engaging said connecting portion;

(f) said body having wall means confining said spring between said legs and forming a stop limiting outward movement of the other end of said spring while exposing said other spring end for engagement with the edge of said circuit board;

(g) said switch body having a surface on the outside of said connecting portion designed to engage a sensing pin;

and means locating the stack of switch assemblies along the length of said circuit board edge.

18. The combination as set forth in claim 17 together with a platen; a series of sensing pins mounted by said platen for registry at corresponding one ends with a data card, said pins having heads at their other corresponding ends positioned respectively to be engaged by said outside surfaces of said connecting portions whereby said springs provide bias forces for said pins, said heads having small areas relative to said outside surfaces of said connecting portions whereby precise alignment is uncritical.

19. The combination as set forth in claim 13 in which said compression spring is a coiled metal element.

20. In combination: a platen; a series of individual printed circuit boards; means supporting said circuit boards in spaced side-by-side relationship so that corresponding edges of the circuit boards are in spaced opposed relationship to one side of said platen; a row of sensing pins for each circuit board and mounted on the platen in approximate alignment with the edge of the corresponding circuit board, said pins having heads at corresponding ends on the side of the platen facing said circuit board edges; a series of individual switch assemblies for each of the circuit boards stacked along the edge of the corresponding circuit board and interposed between said pins and the corresponding circuit board; each switch assembly including (a) a switch body having two opposed legs joined by a central connecting portion;

(b) said legs being spaced from each other to receive between them the edge of the corresponding printed circuit board;

(c) wiper contact means mounted on the inside of one of the legs adjacent the distal end of the leg, said wiper contact means being positioned to engage one side of said circuit board adjacent its said edge;

(d) means operative resiliently to urge said contact wiper means to engage said one side of said circuit board with a contact force for frictionally coupling said switch body to said board;

(e) a compression spring in said switch body and located between said switch body legs adjacent said connecting portion with one end of said spring engaging said connecting portion;

(f) said body having wall means confining said spring between said legs and forming a stop limiting outward movement of the other end of said spring while exposing said other spring end for engagement with the edge of said circuit board;

(g) said switch body having a surface on the outside of said connecting portion designed to engage the head of the corresponding pin.

21. In a switch assembly adapted to be frictionally mounted on the edge of a printed circuit board:

(a) an elongated body of substantially rectangular cross-section;

(b) said body having a slot extending inwardly from one end of said body to bifurcate said body to form legs at one end for reception of the edge of a printed circuit board;

(c) said body having a substantially cylindrical elongated recess at the other end of the body, the axis of the cylindrical recess being located substantially midway between said legs, (d) the diameter of said recess being greater than the width of said slot and said slot intersecting the recess for a substantial part of the recess whereby two shoulders are formed at the forward end of the recess;

(e) a coiled compression spring fitted in said recess with its forward end positioned to engage the edge of a circuit board and to be compressed upon entry of the edge of said circuit board into said recess along the region of the intersection of said slot with said recess; and (f) a wiper contact mounted on the inside of one of said legs at the region forwardly of the said shoulders for engagement with a segment on one side of said circuit board.

22. The combination as set forth in claim 7 together with a coiled retraction spring accommodated between the the legs to be engaged by the edge of the circuit board for providing a bias on the clip urging said clip outwardly of the edge of said circuit board.

23. The combination as set forth in claim 7 in which each clip is provided with a longitudinally extending recess at the trough between the legs and extending along the attached ends of the legs; said contact wiper means being located at the distal ends of the legs beyond said recess; and a coil spring captured in said recess and engageable with the edge of the circuit board for outwardly urging the clip and the wiper means carried thereby.

References Cited

UNITED STATES PATENTS

| | | | |
|---|---|---|---|
| 2,869,790 | 1/1959 | Radke et al. | 200—46 X |
| 2,903,529 | 9/1959 | Hanthron | 200—46 |
| 2,995,700 | 8/1961 | Warren | 200—46 X |
| 3,131,017 | 4/1964 | Mittler. | |
| 3,262,082 | 7/1966 | Gammel. | |
| 3,294,957 | 12/1966 | Young | 200—46 |

FOREIGN PATENTS

| | | |
|---|---|---|
| 1,400,502 | 4/1965 | France. |

OTHER REFERENCES

Krone, German application No. 1,223,913, published September 1966.

ROBERT K. SCHAEFER, Primary Examiner

D. SMITH, Jr., Assistant Examiner

U.S. Cl. X.R.

235—61.11